US012313575B1

(12) United States Patent
Xue et al.

(10) Patent No.: US 12,313,575 B1
(45) Date of Patent: May 27, 2025

(54) MULTI-PROBE MULTI-FREQUENCY NUCLEAR MAGNETIC RESONANCE ROCK SOIL IN-SITU MONITORING SYSTEM

(71) Applicant: Institute of Rock and Soil Mechanics, Chinese Academy of Sciences, Hubei (CN)

(72) Inventors: Qiang Xue, Hubei (CN); Houzhen Wei, Hubei (CN); Yong Wan, Hubei (CN); Xiaolong Ma, Hubei (CN); Hang Ruan, Hubei (CN); Xiang Sun, Hubei (CN); Jiangshan Li, Hubei (CN)

(73) Assignee: Institute of Rock and Soil Mechanics, Chinese Academy of Sciences, Hubei (CN)

(*) Notice: Subject to any disclaimer, the term of this patent is extended or adjusted under 35 U.S.C. 154(b) by 0 days.

(21) Appl. No.: 19/023,328

(22) Filed: Jan. 16, 2025

(30) Foreign Application Priority Data

Jan. 30, 2024 (CN) .......................... 202410126000.X

(51) Int. Cl.
*G01N 24/08* (2006.01)
*G01R 33/3415* (2006.01)
(Continued)

(52) U.S. Cl.
CPC ....... *G01N 24/081* (2013.01); *G01R 33/3415* (2013.01); *G01R 33/3808* (2013.01);
(Continued)

(58) Field of Classification Search
CPC ...... G01N 24/081; G01V 3/32; G01V 11/005; G01R 33/385; G01R 33/3415; G01R 33/383; G01R 33/3808
(Continued)

(56) References Cited

U.S. PATENT DOCUMENTS 2,912,641 A * 11/1959 Ruble ...................... G01V 3/32
 324/303
2,968,761 A * 1/1961 Zimmerman ............ G01V 3/32
 324/303
(Continued)

FOREIGN PATENT DOCUMENTS

CN 1253296 5/2000
CN 113447514 9/2021

*Primary Examiner* — Arlen Soderquist
(74) *Attorney, Agent, or Firm* — JCIP GLOBAL INC.

(57) ABSTRACT

The present disclosure relates to the field of rock soil detection and in particular to a multi-probe nuclear magnetic resonance (NMR) rock soil in-situ monitoring system, which includes a multi-probe component, a spectrograph component, an industrial control computer and a power cable. The multi-probe component includes a shell and multiple nuclear magnetic probes disposed inside the shell. The multiple nuclear magnetic probes are respectively located at the soil layers of different depths and have different measurement frequencies. The spectrograph component is used to transmit and receive NMR-measured radio frequency signals, the industrial control computer is used to transmit a measurement instruction and perform real-time processing on the measurement data, and the power cable is connected with the multiple nuclear magnetic probes, the spectrograph component and the industrial control computer to supply power and transmit the measurement data.

9 Claims, 2 Drawing Sheets

(51) Int. Cl.
  *G01R 33/38* (2006.01)
  *G01R 33/383* (2006.01)
  *G01R 33/385* (2006.01)
  *G01V 3/32* (2006.01)
  *G01V 11/00* (2006.01)

(52) U.S. Cl.
  CPC ............. *G01R 33/383* (2013.01); *G01V 3/32* (2013.01); *G01V 11/005* (2013.01)

(58) Field of Classification Search
  USPC .................................. 324/303; 436/28, 173
  See application file for complete search history.

(56) References Cited

U.S. PATENT DOCUMENTS

| | | | | |
|---|---|---|---|---|
| 3,402,344 A * | 9/1968 | Brown | ..................... | G01V 3/32 324/303 |
| 3,667,035 A * | 5/1972 | Slichter | ..................... | G01V 3/32 324/303 |
| 3,775,671 A * | 11/1973 | Brown | ..................... | G01V 3/32 324/303 |
| 5,291,137 A * | 3/1994 | Freedman | ................ | G01V 3/32 324/303 |
| 6,049,205 A * | 4/2000 | Taicher | ..................... | G01V 3/32 324/303 |
| 6,242,912 B1 * | 6/2001 | Prammer | ............. | G01N 24/081 324/303 |
| 6,246,236 B1 | 6/2001 | Poitzsch et al. | | |
| 6,255,818 B1 * | 7/2001 | Heaton | .................... | G01V 3/32 324/318 |
| 6,291,995 B1 * | 9/2001 | Speier | .................. | G01N 24/081 324/303 |
| 6,788,263 B2 * | 9/2004 | Clark | ..................... | E21B 47/13 324/303 |
| 2002/0175682 A1 * | 11/2002 | Chen | ....................... | G01V 3/32 324/303 |
| 2003/0001568 A1 | 1/2003 | Edwards | | |
| 2013/0093422 A1 * | 4/2013 | Morys | ..................... | H01Q 1/04 324/303 |
| 2013/0187647 A1 * | 7/2013 | Walsh | ..................... | G01V 3/32 324/303 |
| 2014/0117984 A1 * | 5/2014 | Conrad | ................... | G01V 3/32 324/303 |
| 2017/0082773 A1 | 3/2017 | Xiao et al. | | |
| 2017/0176626 A1 * | 6/2017 | Paulsen | .................... | G01V 3/32 |
| 2018/0203153 A1 * | 7/2018 | Mitchell | ................... | G01V 3/38 |
| 2018/0347351 A1 * | 12/2018 | Chen | ................... | G01N 15/088 |
| 2020/0217192 A1 * | 7/2020 | Li | ......................... | G01R 33/383 |
| 2020/0241092 A1 * | 7/2020 | Jachmann | .......... | G01R 33/3808 |
| 2021/0208301 A1 * | 7/2021 | Reiderman | ............ | G01R 33/44 |

* cited by examiner

MULTI-PROBE MULTI-FREQUENCY NUCLEAR MAGNETIC RESONANCE ROCK SOIL IN-SITU MONITORING SYSTEM

CROSS-REFERENCE TO RELATED APPLICATION

This application claims the priority benefit of China application serial no. 202410126000.X, filed on Jan. 30, 2024. The entirety of the above-mentioned patent application is hereby incorporated by reference herein and made a part of this specification.

TECHNICAL FIELD

The present disclosure relates to the field of rock soil detections and in particular to a multi-probe nuclear magnetic resonance (NMR) rock soil in-situ monitoring system.

BACKGROUND

The common soil moisture monitoring methods include a frequency domain reflection method, a time domain reflection method, a drying method and a nuclear magnetic resonance method and the like. In the frequency domain reflection method and the time domain reflection method for soil in-situ measurement, a dielectric constant is measured to indirectly reflect a water content of soil. But, the methods are susceptible to many factors and instable in accuracy. In the drying method and the nuclear magnetic resonance method, it is usually required to drill and collect soil samples by human labor, and then obtain water-content-of-soil information by experiments in laboratories. However, the undisturbed oil sampling process will inevitable suffer additional disturbances caused by soil collection, transportation and sample making, and it is also difficult to restore underground conditions by carrying out experimental tests after sample collection.

On the other hand, the water content and distribution of the rock soils have strong spatio-temporal variability and it is possible that the samples are not representative. Furthermore, in the current related arts, it is difficult to obtain the information of the changes on the water content and the physical property of the underground rock soil over time. Therefore, it is necessary to develop a system for performing long-time and continuous monitoring on the rock soils, so as to realize in-situ monitoring for the underground rock soils and especially for the polluted sites.

SUMMARY

In order to carry out long-term and continuous in-situ monitoring on the rock soils, the present disclosure provides a multi-probe nuclear magnetic resonance (NMR) rock soil in-situ monitoring system.

The multi-probe NMR rock soil in-situ monitoring system provided by the present disclosure employs the following technical solution.

A multi-probe nuclear magnetic resonance (NMR) rock soil in-situ monitoring system, including:
  a multi-probe component, comprising a cylindrical shell and a plurality of nuclear magnetic probes disposed inside the cylindrical shell, wherein the plurality of the nuclear magnetic probes are sequentially arranged in a spacing along an axial direction of the cylindrical shell, and the plurality of the nuclear magnetic probes are located at soil layers of different depths respectively and have different measurement frequencies;
  a spectrograph component, configured to transmit and receive NMR-measured radio frequency signals;
  an industrial control computer, configured to transmit a measurement instruction and perform real-time processing on measurement data; and
  a power cable, connected to the multiple nuclear magnetic probes, the spectrograph component and the industrial control computer to supply power and transmit the measurement data.

The multi-probe component is descended along a drill hole to enable multiple nuclear magnetic probes to be buried at soil layers of different depths respectively to perform simultaneous measurement on nuclear magnetic information of undisturbed soils at different depths; data collected by the nuclear magnetic probes with different frequencies are transmitted via a power cable in a unified way to a ground spectrograph component, so as to distinguish the data of multiple nuclear magnetic probes based on the frequencies of the collected signals.

The spectrograph component is a collection system for controlling signal reception and transmission, which is used to control a radio frequency coil of each nuclear magnetic probe to transmit a radio frequency signal of a different frequency, and receive, by a multi-channel receiver, a signal of a different frequency measured by each probe and thus distinguish signal frequencies by using spectrum analysis and then transmit the NMR collected signals of the underground soils to an industrial control computer.

The industrial control computer includes a data processing component used to process NMR collected data. After each collection, each nuclear magnetic probe measures an echo signal of the soil at the corresponding depth, and the data processing component performs inversion on the NMR echo signals collected by multiple probes to obtain T2 distribution (transverse relaxation time distribution) spectra of the undisturbed soils at different depths. The T2 distribution spectrum of each depth point reflects, to some extent, a water content distribution, a micro-pore structure and oil-water fluid information of the soil. The water ratio can be obtained by performing integration on the T2 distribution spectrum. Further, by comparing the NMR information of the soils at different depths, the non-homogeneity of the soils can be evaluated.

The multi-probe component is buried for long in the underground soils to realize long-term and continuous monitoring for the water content information of the soils and the oil pollutants in the pollution sites.

Furthermore, each of nuclear magnetic probes includes a sleeve, a magnetic body fixedly disposed inside the sleeve and a radio frequency coil wound around the sleeve. The radio frequency coil is connected with a radio frequency coil circuit, and the power cable penetrates through multiple nuclear magnetic probes and connected with each radio frequency coil circuit.

Further, each of the nuclear magnetic probes further includes a sleeve pipe penetrated through the sleeve, the sleeve pipe and the sleeve share a same axis and are fixedly connected with each other, and the sleeve pipe has a longer axial length than the sleeve. Adjacent two of the sleeve pipes are connected by threads, and the power cable is mounted inside the sleeve pipe.

Further, in each of the nuclear magnetic probes, the magnetic body includes two hollow cylindrical magnets with two opposite polarities, the two hollow cylindrical magnets are arranged in a spacing along their own axial directions to generate an annular static magnetic field B0 around an axis; the radio frequency coil is located between the two hollow cylindrical magnets, and a radio frequency magnetic field B1 generated by the radio frequency coil is in the axial direction of the magnetic body and perpendicular to the annular static magnetic field B0.

Further, in different nuclear magnetic probes, the magnetic field strengths of the magnetic bodies are different from each other, such that resonant frequencies of the nuclear magnetic probes are different from each other.

The nuclear magnetic probes use magnetic bodies with different magnetic field strengths. Based on a relationship $$f = \frac{\omega}{2\pi} = \frac{\gamma B_0}{2\pi}$$

between the magnetic field strength B0 and a resonant frequency, it is found that each nuclear magnetic probe has a different resonant frequency f from another. Further, frequency of the radio frequency coil of each nuclear magnetic probe is tuned to be consistent with the magnetic field strength of the static magnetic field B0 generated by the magnetic body such that the nuclear magnetic probes work under different frequencies from each other. The data collected by the radio frequency coils of different frequencies are transmitted via a power cable to a ground spectrograph component, so as to realize the distinguishing of the data of multiple nuclear magnetic probes based on the collected signal frequency.

Further, a groove for winding the radio frequency coil is disposed at a peripheral side of a middle part of the sleeve.

Further, an end of the cylindrical shell away from a ground is fixedly connected with a top cover, and a surface of the top cover in contact with soils is a convex arc surface.

The convex arc surface helps smoothly descend the multi-probe component into the drill hole, avoiding the probes being stuck in the drill hole.

Further, the sleeve pipes are made of a non-magnetic material.

The non-magnetic material enables the main magnetic field and the radio frequency magnetic field of the nuclear magnetic probes to penetrate through the sleeve pipe to a to-be-measured soil region.

Further, the sleeves are made of a polytetrafluoroethylene material.

The polytetrafluoroethylene material allows the magnetic field to penetrate through itself and helps reduce the background noised interference in the NMR measured signals.

Further, the cylindrical shell is made of a non-magnetic and non-conductive material.

The non-magnetic and non-conductive material enables the main magnetic fields and the radio frequency magnetic fields of the nuclear magnetic probes to penetrate through the shell to the to-be-measured soil region while it is guaranteed that the probes have good waterproof and corrosion-resistant performances when they are descended and buried in the underground soils.

In conclusion, the present disclosure includes at least one of the following beneficial effects.

1. Multiple nuclear magnetic probes are respectively buried at the soil layers of different depths to perform real-time in-situ measurement on the nuclear magnetic information of the undisturbed soils at different depths and obtain the water content, the water moisture distribution and the like of the undisturbed soils at different depths, and then the non-homogeneity of the soils is evaluated by comparing the measurement results of the soil layers of different depths.

2. The nuclear magnetic probes use magnetic bodies with different magnetic field strengths such that the nuclear magnetic probes can work under different frequencies from each other. The data collected by the radio frequency coils of different frequencies are transmitted via a power cable to the ground spectrograph component, so as to realize the distinguishing of the data of multiple nuclear magnetic probes based on the collected signal frequency.

3. The multi-probe component is buried for long in the underground soils to realize long-term and continuous monitoring for the water content information of the soils and the oil pollutants in the pollution sites.

BRIEF DESCRIPTIONS OF THE DRAWINGS

Numerals of the drawings are described below: 1. nuclear magnetic probe, 2. magnet, 3. radio frequency coil, 4. sleeve, 5. radio frequency coil circuit, 6. power cable, 7. shell, 8. sleeve pipe, and 9. top cover.

DETAILED DESCRIPTIONS OF EMBODIMENTS

The present disclosure will be further detailed below with the drawings 1 to 2.

Figure 1:
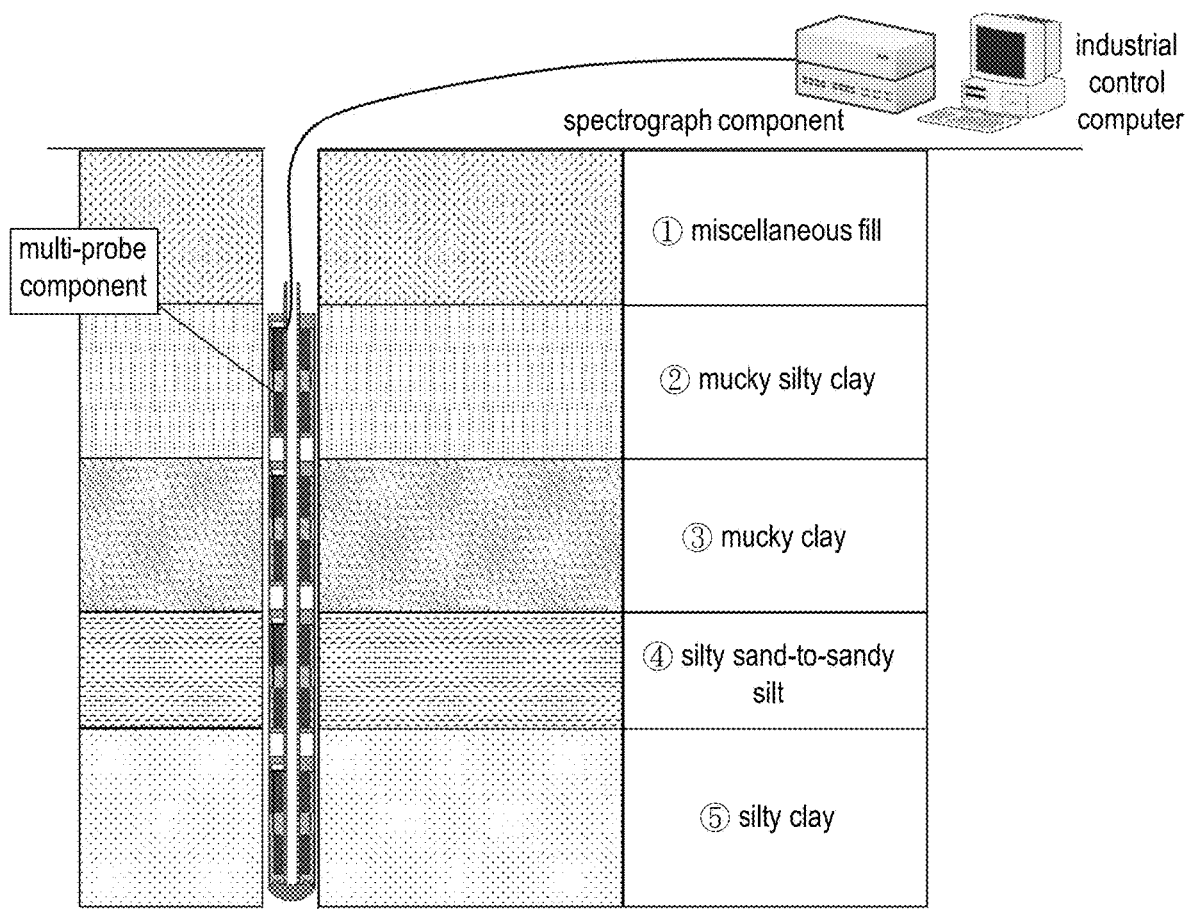
FIG. 1 is a schematic diagram illustrating an entire structure of the system according to an embodiment of the present disclosure.
Figure 2:
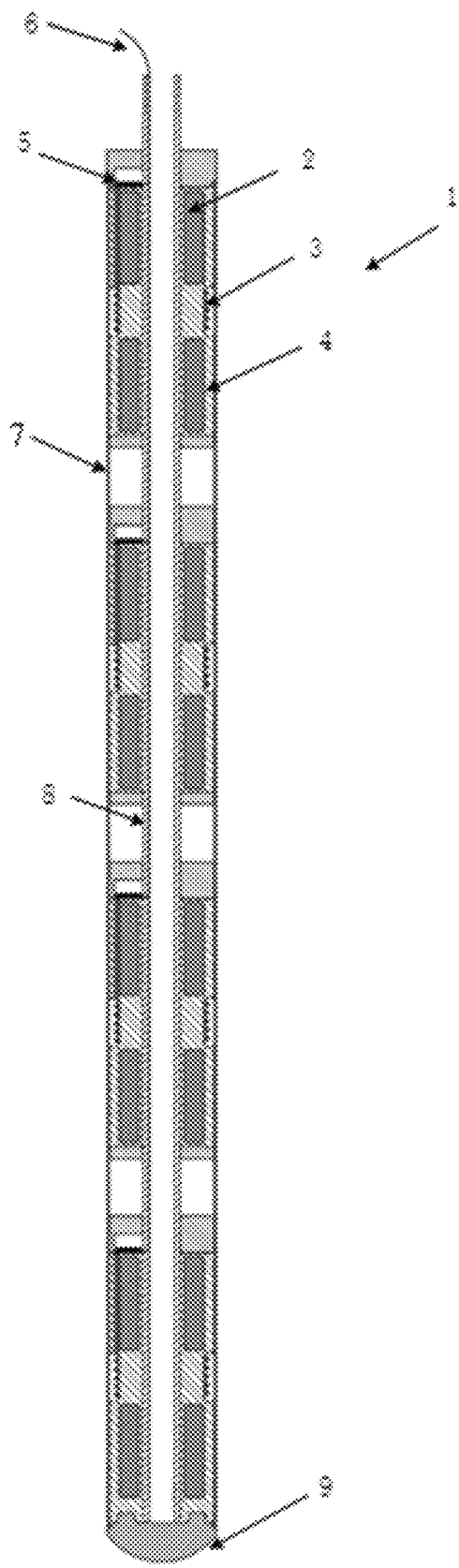
FIG. 2 is a schematic diagram illustrating a sectional structure of a multi-probe component according to an embodiment of the present disclosure.

An embodiment of the present disclosure provides a multi-probe nuclear magnetic resonance (NMR) rock soil in-situ monitoring system. As shown in FIGS. 1 and 2, the multi-probe NMR rock soil in-situ monitoring system includes a multi-probe component, a spectrograph component, an industrial control computer, and a power cable 6. The multi-probe component includes a cylindrical shell 7, and multiple nuclear magnetic probes 1 fixedly disposed inside the shell 7. In this embodiment, there are four nuclear magnetic probes 1. The multiple nuclear magnetic probes 1 are arranged in a spacing sequentially along an axial direction of the shell 7, and the multiple nuclear magnetic probes 1 are respectively located at the soil layers of different depths and have different measurement frequencies. The power cable 6 is connected with the multiple nuclear magnetic probes 1, the spectrograph component and the industrial control computer to supply power and transmit measurement data.

The multi-probe component is descended a drill hole to enable multiple nuclear magnetic probes 1 to be buried at soil layers of different depths respectively to perform simultaneous measurement on nuclear magnetic information of undisturbed soils at different depths; data collected by the nuclear magnetic probes with different frequencies are transmitted via the power cable 6 in a unified way to the ground spectrograph component, so as to distinguish the data of multiple nuclear magnetic probes 1 based on the collected signal frequency.

The spectrograph component is a collection system for controlling signal reception and transmission, which is used to control the nuclear magnetic probes 1 to transmit radio frequency signals of different frequencies, and receive, by a multi-channel receiver, a signal of a different frequency measured by each nuclear magnetic probe 1 and thus distinguish signal frequencies by using spectrum analysis and then transmit the collected NMR signals of the underground soils to an industrial control computer.

The industrial control computer is used to transmit a measurement instruction and perform real-time processing on the measurement data. After being collected, each nuclear magnetic probe 1 measures an NMR echo signal of the soil of the corresponding depth, and the data processing component of the industrial control computer performs inversion on the NMR echo signals collected by multiple nuclear magnetic probes to obtain T2 distribution spectra of the undisturbed soils at different depths. The T2 spectrum of each depth point reflects, to some extent, a water content distribution, a micro-pore structure and oil-water fluid information of the soil. The water ratio can be obtained by performing integration on the T2 spectrum. Further, by comparing the NMR information of the soils at different depths, the non-homogeneity of the soils can be evaluated.

The multi-probe component is buried for long in the underground soils to realize long-term and continuous monitoring for the water content information of the soils and the oil pollutants in the pollution sites.

As shown in FIG. 2, each nuclear magnetic probe 1 includes a sleeve 4 and a sleeve pipe 8 penetrated into the sleeve 4. The sleeve pipe 8 and the sleeve 4 share a same axis and both of them are fixedly bonded together by epoxy resin. An outer sidewall of the sleeve 4 is abutted against an inner sidewall of the shell 7. The sleeve pipe 8 has a longer axial length than the sleeve 4. Two adjacent sleeve pipes 8 are connected by threads to connect any number of nuclear magnetic probes 1; and the power cable 6 is mounted inside the sleeve pipes 8.

Furthermore, with reference to FIG. 2, a magnetic body is fixed inside each sleeve 4, and the magnetic body includes two hollow cylindrical magnets 2. The two hollow cylindrical magnets 2 are arranged in a spacing along an axial direction of the hollow cylindrical magnets 2, where the polarities of the two hollow cylindrical magnets 2 are opposite, namely, the two hollow cylindrical magnets 2 have opposite magnetic field directions. The sleeve pipe 8 is penetrated through the hollow cylindrical magnets 2. A radio frequency coil 3 is disposed around the sleeve 4, and the radio frequency coil 3 is located between two magnets 2. A groove for winding the radio frequency coil 3 is disposed at a peripheral side of the middle part of the sleeve 4. A radio frequency coil circuit 5 is connected with the radio frequency coil 3 and each radio frequency coil circuit 5 is connected with the power cable 6.

In each nuclear magnetic probe 1, the two hollow cylindrical magnets 2 generate an annular static magnetic field B0 around the axis, where a uniform region of the static magnetic field B0 is a sensitive region; a radio frequency magnetic field B1 generated by the radio frequency coil 3 is in the axial direction of the magnetic body and perpendicular to the static magnetic field B0.

Furthermore, in different nuclear magnetic probes 1, the magnetic bodies have different magnetic field strengths. Based on the relationship between the magnetic field strength B0 and a resonant frequency, i.e.

$$f = \frac{\omega}{2\pi} = \frac{\gamma B_0}{2\pi},$$

it is found that each nuclear magnetic probe 1 has a different resonant frequency f. The frequency of the radio frequency coil 3 of each nuclear magnetic probe 1 is tuned to be consistent with the magnetic field strength of the static magnetic field B0 generated by the magnetic body, such that the nuclear magnetic probes 1 can work under different frequencies. The data collected by the radio frequency coils 3 with different frequencies are transmitted by the power cable 6 to a ground spectrograph component, so as to realize the distinguishing of the data of the multiple nuclear magnetic probes 1 based on the collected signal frequency.

In order to enable the magnetic field of the nuclear magnetic probes 1 to reach a to-be-measured soil region, the sleeve pipe 8 is made of non-magnetic stainless steel and the sleeve 4 is made of polytetrafluoroethylene and the shell 7 is made of non-magnetic and non-conductive glass fiber reinforced plastic.

Therefore, the main magnetic field and the radio frequency magnetic field of the nuclear magnetic probes 1 can penetrate through the sleeve pipe 8, the sleeve 4 and the shell 7 to a to-be-measured soil region. Furthermore, the use of the polytetrafluoroethylene material for the sleeve 4 helps reduce the interference caused by the background noise in the NMR measured signals. The use of non-magnetic non-conductive material for the shell 7 further guarantees that the multi-probe component has good waterproof and corrosion-resistant performances when it is descended and buried in the underground soils.

With reference to FIG. 2, an end of the shell 7 away from the ground is fixedly connected with a top cover 9 made of non-magnetic stainless steel. A surface of the top cover 9 in contact with the soils is a convex arc surface. The convex arc surface helps smoothly descend the multi-probe component into the drill hole, avoiding the probes being stuck in the drill hole.

The implementation principle of the multi-probe NMR rock soil in-situ monitoring system in the embodiments of the present disclosure is shown below: the multi-probe component is descended into the drill hole to enable multiple nuclear magnetic probes 1 to be respectively buried in the soil layers of different depths so as to perform simultaneous measurement on nuclear magnetic information of the undisturbed soils at different depths; the data collected by the nuclear magnetic probes 1 of different frequencies are transmitted in a unified way to the ground spectrograph component via the power cable 6, and then signal frequency distinguishing is performed on the data by spectrum analysis and then the collected NMR signals of the underground soils are transmitted to the industrial control computer. By the data processing component, inversion is performed on the NMR echo signals collected by the multiple nuclear magnetic probes to obtain T2 distribution spectra of the undisturbed soils at different depths. The T2 spectrum of each depth point reflects, to some extent, a water content distribution, a micro-pore structure and oil-water fluid information of the soil. The water ratio can be obtained by performing integration on the T2 spectrum. Further, by comparing the NMR information of the soils at different depths, the non-homogeneity of the soils can be evaluated. The multi-probe component is buried for long in the underground soils to realize long-term and continuous monitoring for the water content information of the soils and the oil pollutants in the pollution sites.

The above are preferred embodiments of the present disclosure and not intended to limit the scope of protection of the present disclosure. Therefore, any equivalent changes made based on the structures, shapes and principles of the present disclosure shall all fall within the scope of protection of the present disclosure.

What is claimed is:

1. A multi-probe nuclear magnetic resonance (NMR) rock soil in-situ monitoring system, comprising:
   a multi-probe component, comprising a cylindrical shell and a plurality of nuclear magnetic probes disposed inside the cylindrical shell, wherein the plurality of the nuclear magnetic probes are sequentially arranged in a spacing along an axial direction of the cylindrical shell, and the plurality of the nuclear magnetic probes are located at soil layers of different depths respectively and have different measurement frequencies; each of the nuclear magnetic probes comprises a magnetic body, and the magnetic bodies in different nuclear magnetic probes have different magnetic field strengths such that each of the nuclear magnetic probes has a different resonant frequency;
   a spectrograph component, configured to transmit and receive NMR-measured radio frequency signals;
   an industrial control computer, configured to transmit a measurement instruction and perform real-time processing on measurement data; and
   a power cable, connected to the plurality of the nuclear magnetic probes, the spectrograph component and the industrial control computer to supply power and transmit the measurement data.

2. The multi-probe NMR rock soil in-situ monitoring system according to claim 1, wherein the each of the nuclear magnetic probes further comprises a sleeve and a radio frequency coil wound around the sleeve, the radio frequency coil is connected with a radio frequency coil circuit, the power cable is penetrated through the plurality of the nuclear magnetic probes and the power cable is connected with each of the radio frequency coil circuits, and the magnetic bodies are fixedly disposed inside the sleeves.

3. The multi-probe NMR rock soil in-situ monitoring system according to claim 2, wherein the nuclear magnetic probe further comprises a sleeve pipe penetrated through the sleeve, the sleeve pipe and the sleeve share a same axis and are fixedly connected with each other, the sleeve pipe has a longer axial length than the sleeve, adjacent two of the sleeve pipes are connected by threads, and the power cable is mounted inside the sleeve pipe.

4. The multi-probe NMR rock soil in-situ monitoring system according to claim 3, wherein in each of the nuclear magnetic probes, the magnetic body comprises two hollow cylindrical magnets with two opposite polarities, the two hollow cylindrical magnets are arranged in a spacing along their own axial directions to generate an annular static magnetic field B0 around an axis; the radio frequency coil is located between the two hollow cylindrical magnets, and a radio frequency magnetic field B1 generated by the radio frequency coil is in the axial direction of the magnetic body and perpendicular to the annular static magnetic field B0.

5. The multi-probe NMR rock soil in-situ monitoring system according to claim 4, wherein a groove for winding the radio frequency coil is disposed at a peripheral side of a middle part of the sleeve.

6. The multi-probe NMR rock soil in-situ monitoring system according to claim 3, wherein an end of the cylindrical shell away from a ground is fixedly connected with a top cover, and a surface of the top cover in contact with soils is a convex arc surface.

7. The multi-probe NMR rock soil in-situ monitoring system according to claim 3, wherein the sleeve pipes are made of a non-magnetic material.

8. The multi-probe NMR rock soil in-situ monitoring system according to claim 2, wherein the sleeves are made of a polytetrafluoroethylene material.

9. The multi-probe NMR rock soil in-situ monitoring system according to claim 1, wherein the cylindrical shell is made of a non-magnetic and non-conductive material.

* * * * *